United States Patent
Gao et al.

(10) Patent No.: US 7,652,539 B2
(45) Date of Patent: Jan. 26, 2010

(54) MULTI-STAGE BROADBAND AMPLIFIERS

(76) Inventors: Huai Gao, 21 California Ave., Apt. # 319, Irvine, CA (US) 92612; Aroonchat Chatchaikarn, 6462 Adobe Circle Rd. South, Irvine, CA (US) 92612; Huinan Guan, 11 Promenade, Irvine, CA (US) 92612; Guann-Pyng Li, 20 Young Ct., Irvine, CA (US) 92612; Li-Wu Yang, 12829 Berkhamsted St., Cerritos, CA (US) 90703; Daniel Yang, 1416 Brinkley Ave., Los Angeles, CA (US) 90049

( * ) Notice: Subject to any disclaimer, the term of this patent is extended or adjusted under 35 U.S.C. 154(b) by 0 days.

(21) Appl. No.: 11/264,291

(22) Filed: Oct. 31, 2005

(65) Prior Publication Data
US 2007/0096831 A1 May 3, 2007

(51) Int. Cl.
*H03F 3/68* (2006.01)
(52) U.S. Cl. ...................................... 330/311
(58) Field of Classification Search ............... 330/311, 330/310, 98, 150, 302
See application file for complete search history.

(56) References Cited

U.S. PATENT DOCUMENTS

| | | | |
|---|---|---|---|
| 5,012,203 A | 4/1991 | Deibele et al. | |
| 5,559,472 A | 9/1996 | Kobayashi | |
| 6,353,367 B1 * | 3/2002 | Chiu | 330/311 |
| 6,472,941 B2 * | 10/2002 | Shigematsu | 330/286 |
| 6,731,175 B1 * | 5/2004 | Chen | 330/311 |
| 6,864,750 B2 | 3/2005 | Shigematsu | |
| 7,098,741 B2 * | 8/2006 | Litwin et al. | 330/297 |
| 7,199,658 B2 * | 4/2007 | Floyd et al. | 330/251 |

OTHER PUBLICATIONS

Gao et al., "*A novel design technique for bandwidth enhancement in InGaP HBT broadband amplifier*", TENCOM 2004, 2004 IEEE Region 10 Conference, Nov. 21-24, 2004, vol. C, pp. 632-634.

Gao et al., "*A new traveling wave matching structure for enhancing the bandwidth of MMIC braodband amplifiers*", IEEE Microwave and Wireless Components Letters, Aug. 2005, vol. 15, No. 8, pp. 508-509.

Shigematsu et al., "*A 49-GHz Preamplifier with a Transimpedance Gain of 52 dBΩ Using InP HEMTS*", IEEE Journal of Solid-State Circuits, vol. 36, No. 9, Sep. 2001, pp. 1309-1313.

Honjo et al., "*GaAs FET Ultrabroad-Band Amplifiers for Gbit/s Data Rate Systems*", IEEE Transactions on Microwave Theory and Techniques, vol. MIT-29, No. 7, Jul. 1981, pp. 629-636.

(Continued)

*Primary Examiner*—Robert Pascal
*Assistant Examiner*—Alan Wong
(74) *Attorney, Agent, or Firm*—Orrick, Herrington & Sutcliffe LLP

(57) ABSTRACT

Provided herein are multi-stage broadband amplifier configured to achieve a high gain-bandwidth product in a non-distributed architecture and methods for designing the same. The broadband amplifier can include an input stage having a broadband matching unit and an input buffer unit, a gain stage having an RLC network and a amplifier unit and an output stage having a common collector amplifier and an RC compensation unit.

11 Claims, 4 Drawing Sheets

OTHER PUBLICATIONS

Kobayashi, "*A Novel HBT Distributed Amplifier Design Topology Based on Attenuation Compensation Techniques,*" IEEE Transactions on Microwave Theory and Techniques, vol. 42, No. 12, Dec. 1964, pp. 2583-2589.

Deibele et al., "*Attenuation Compensation in Distributed Amplifier Design*", IEEE Transactions on Microwave Theory and Techniques, vol. 37, No. 9, Sep. 1989, pp. 1425-1433.

\* cited by examiner

MULTI-STAGE BROADBAND AMPLIFIERS

FIELD OF THE INVENTION

The present invention relates to the use of multi-stage broadband amplifiers capable of achieving a high gain-bandwidth product and low power consumption with a non-distributed architecture.

BACKGROUND INFORMATION

Broadband amplifiers are key components in fiber-optic communication systems, future millimeterwave communication systems, and broadband test instruments, to name a few. Distributed amplifiers (DAs) have dominated broadband amplifiers design for the last two decades and have proved sufficient to realize broadband signal amplification covering multi-octave frequency bands. For instance, a Traveling Wave Matching (TWM) design technique has been developed from the DA concept for broadband matching and has been applied to the design and demonstration of several single stage DAs in K. L Koon, et al., "High Gain and Ultra Wideband SiGe/BiCMOS Cascaded Single Stage Distributed Amplifier for 4G RF Front-End Applications," 14th IEEE 2003 International Symposium on Personal, Indoor and Mobile Radio Communication Proceedings, pp. 2180-2184 and in Virdee, A. S, et al., "Experimental Perfdrmance of Ultrabroadband Amplifier Design Concept Employing Cascaded Reactively Terminated Single-stage Distributed Amplifier Configuration," Electronics Letters, Volume 36, Issue 18, Aug. 31, 2000, pp. 1554-56. Previously, a series of resistors, inductors and capacitors (R, L and C) was employed in each stage of the cascode distributed amplifier implemented with InP HEMTs in H. Shigematsu et al., "A 49-GHz preamplifier with a transimpedance gain of 52 dBΩ using InP HEMTs," IEEE J. Solid State Circuits., vol. 36, no. 9, pp. 1309-1313, September 2001. A high gain-bandwidth product was reported, however, these amplifiers consumed large power and were larger in size due to the distributed amplification technique. In most DA amplifiers, the operable bandwidth that can be achieved is typically between one-tenth and one-third of the cutoff frequency ($f_T$) of the amplifier, i.e., the frequency at which the transistor current gain in the amplifier is equal to one. Thus, to achieve a high bandwidth, the amplifier typically requires a high $f_T$. However, fabrication costs for high $f_T$ amplifiers are great due to poor yields and other fabrication difficulties.

Many publications have reported broadband amplifiers with high gain-bandwidth products. To achieve high gain-bandwidth products in broadband amplifiers, one typically relies on either device technology, i.e. using transistors with very high $f_T$ values and maximum frequencies ($f_{max}$), circuit topology, i.e. designing distributed amplifiers (DAs), or operating transistors with high current density to achieve high $f_T$ and $f_{max}$. These options typically lead to more expensive technology, higher dc power consumption, and poor reliability, respectively.

Therefore, a broadband amplifier capable of achieving a high gain-bandwidth product while using typical transistors operated at typical current densities for biasing is needed, which will alleviate the reliability, dc power consumption and cost concerns of the conventional implementations.

SUMMARY

Provided herein are multi-stage broadband amplifiers and methods for designing the same. In one exemplary embodiment, which is described below as an example only and not to limit the invention, the broadband amplifier has a non-distributed configuration and includes an input stage including a broadband matching unit coupled with an input buffer unit, the input stage being configured to receive an input signal, a gain stage comprising an amplifier unit coupled with an RLC (resistance-inductance-capacitance) network and an output stage comprising a common collector amplifier, the output stage configured to output an output signal.

The broadband matching unit can include an input node configured to receive the input signal, a first LC section coupled with the input node, the first LC section having a first characteristic impedance and a first cutoff frequency, a second LC section coupled with the first LC section, the second LC section having a second characteristic impedance and a second cutoff frequency and a third LC section coupled with the first and second LC sections and the input buffer unit, the third LC section having a third characteristic impedance and a third cutoff frequency, where each LC section is coupled together at the same node.

The amplifier unit can be any amplifier unit, including, but not limited to a cascode amplifier. The cascode amplifier can include a first transistor having a first base, a first emitter and a first collector, where the first base is coupled with the input buffer unit and the first emitter is coupled with a reference node and a second transistor having a second base, a second emitter and a second collector, where the second base and second collectors are coupled with the RLC network, the second emitter is coupled with the first collector of the first transistor and the second collector is resistively coupled with a power supply node.

The RLC network can be configured for gain peaking, i.e., an extra amount of gain generated to increase gain or extend bandwidth, and can include a first conductive path between the second base of the second transistor and the reference node, the first conductive path including an inductor, a capacitor and a first resistor.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims. It is also intended that the invention is not limited to require the details of the example embodiments.

BRIEF DESCRIPTION OF THE FIGURES

The details of the invention, including fabrication, structure and operation, may be gleaned in part by study of the accompanying figures, in which like reference numerals refer to like segments.

DETAILED DESCRIPTION

Figure 1:
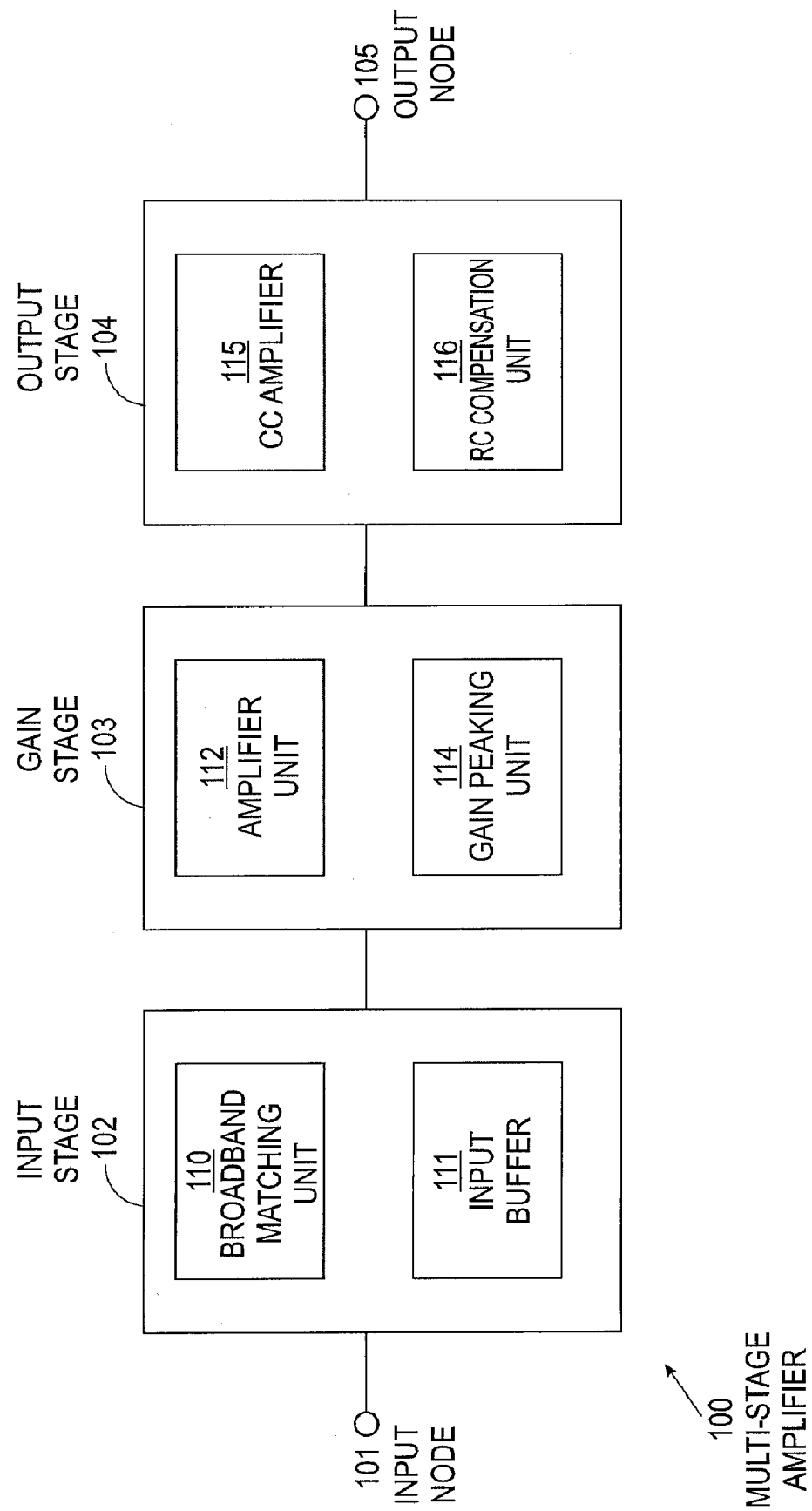
FIG. 1 is a block diagram of an exemplary embodiment of the broadband amplifier.

Described herein are multi-stage broadband amplifiers having a high gain-bandwidth product and a non-distributed architecture, for use in a wide variety of applications. FIG. 1 depicts an exemplary embodiment of multi-stage broadband amplifier 100. In this embodiment, multi-stage amplifier 100 includes an input node 101 for receiving a radio-frequency (RF) input signal to be amplified, an input stage 102, a gain stage 103, an output stage 104 and an output node 105 on which the amplified input signal is output as an RF output signal.

Input stage 102 preferably includes a TWM broadband matching unit 110 and an input buffer 111. Input stage 102 is preferably configured to balance the impedance of the input signal source with amplifier 100 over a wide range of relatively high and low frequencies. Gain stage 103 preferably includes an amplifier unit 112 and an RLC network 114, which is preferably configured to peak the gain of amplifier 100 and will be referred to herein as "gain peaking unit 114." Gain stage 103 is preferably configured to achieve a high gain-bandwidth product without over-stressing any transistors within cascode amplifier 112 during biasing. Output stage 104 preferably includes common collector amplifier 115 and RC (resistance-capacitance) compensation unit 116. Output stage 104 is preferably configured to achieve a low output reflection coefficient ($S_{22}$) over the operable bandwidth and provide amplifier 100 with output driving capability.

In addition to these features, broadband amplifier 100 can also achieve a low input reflection coefficient ($S_{11}$) and a low loss. Broadband amplifier 100 can operate at a bandwidth that is generally between one-half of $f_T$ and a value approaching $f_T$, thereby allowing fabrication of amplifier 100 with higher yields and lower costs than conventional amplifiers.

Broadband amplifier 100 can be implemented in numerous applications. Broadband amplifier 100 can be implemented in fiber-optic communications as a modulator driver, a limiting amplifier, an automatic gain control (AGC) amplifier and a transimpedance amplifier. Broadband amplifier 100 can also be employed in various frequency bands as a general-purpose amplifier in wireless communication systems, testing equipment, and military electronics warfare systems, just to name a few. It should be understood that these examples are illustrative of the many types of applications in which broadband amplifier 100 can be implemented, and by no means serves to limit the usage of amplifier 100 to only these applications. While broadband amplifier 100 is not limited to usage in any one frequency band, it should be noted that broadband amplifier 100 can be used in a wide range of frequency bands including, but not limited to 20 kilohertz (khz)-23 Gigahertz (Ghz).

Broadband amplifier 100 can also be implemented in a host of different process technology configurations including, but not limited to, gallium arsenide (GaAs) heterojunction bipolar transistors (HBTs), silicon germanium (SiGe) HBTs, indium phosphide (InP) HBTs, indium gallium phosphide (InGaP) HBTs, GaAs field effect transistors (FETs), InP FETs, silicon (Si) FETs, Si bipolar junction transistors (BJTs) and the like.

Figure 2:
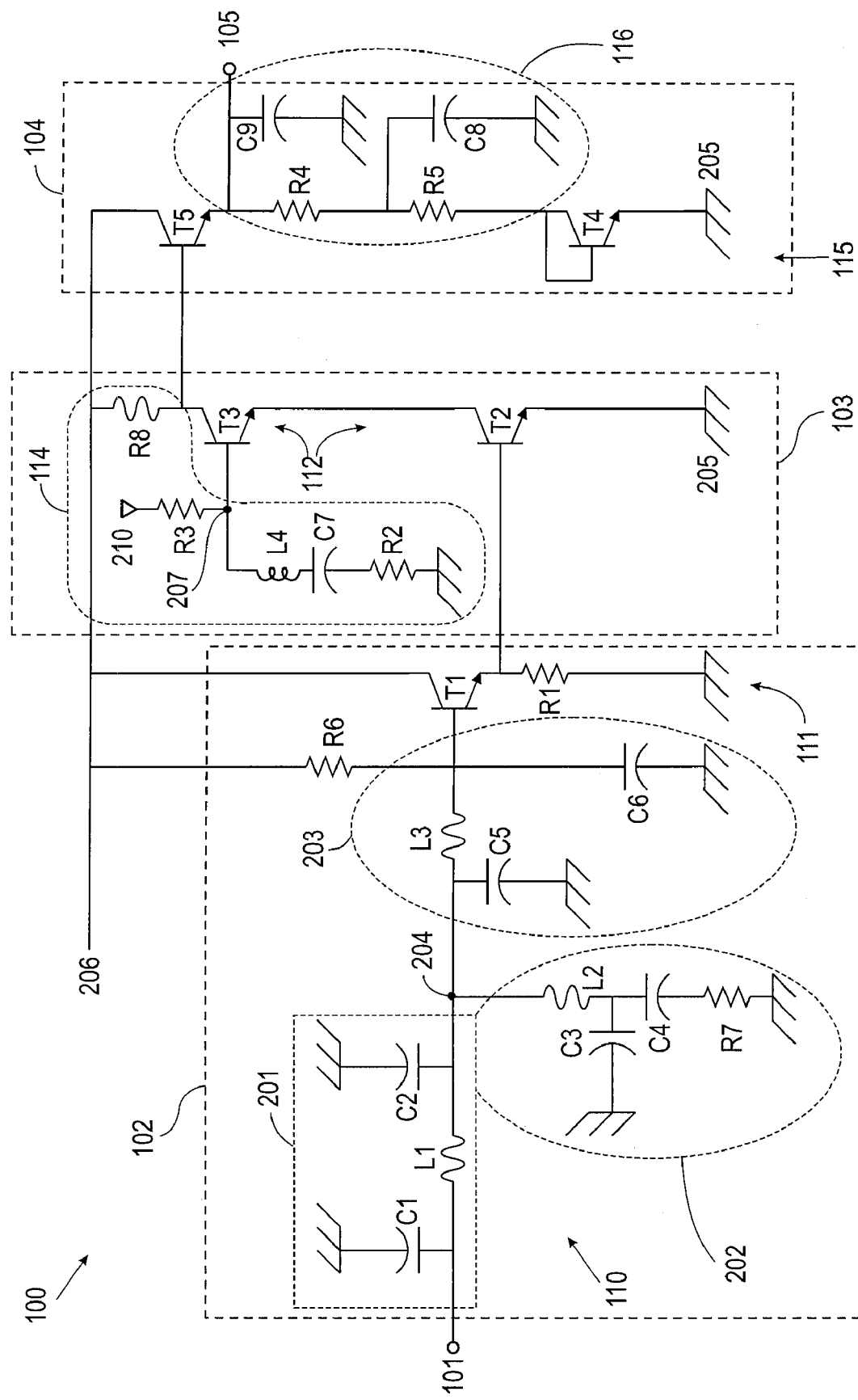
FIG. 2 is a schematic view depicting another exemplary embodiment of the broadband amplifier.

FIG. 2 depicts another exemplary embodiment of multi-stage broadband amplifier 100. In this embodiment, TWM broadband matching unit 110 is an artificial transmission line and includes three artificial transmission line sections 201-203, each having a separate (but not necessarily different) characteristic impedance and cutoff frequency. Each of sections 201, 202 and 203 are LC (inductance-capacitance) sections configured to imitate a transmission line. Each of sections 201-203 are coupled together at node 204. Here, artificial transmission line section 203 is coupled directly with the base of HBT T1 of input buffer unit 111. Artificial transmission line section 203 is configured to absorb the input capacitance of transistor T1 and can be used as a matching and compensation circuit for extending the gain of amplifier 100 at relatively high frequency ranges. In this embodiment, section 203 includes an inductor L3 coupled between input buffer unit 111 and node 204, a capacitor C5 coupled between node 204 and a reference node 205, which in this embodiment is ground, and another capacitor C6 coupled between the base of transistor T1 and reference node 205.

Artificial transmission line section 202 is configured for use at relatively lower frequencies and to improve the input matching at low frequencies. Section 202 has an input impedance that is preferably almost equal to the input impedance of the input signal source (not shown), which is typically 50 ohms ($\Omega$) at low frequencies. This can alleviate the need to use a 50$\Omega$ termination for matching at input node 101 and can allow amplifier 100 to avoid the associated 3-dB loss. As the operation frequency increases, the input impedance of this section can vary accordingly. Section 202 preferably has an input impedance much higher than that of input buffer unit 111 at relatively higher operation frequencies, which results in section 202 being close to open and having minimal effect on the operation of amplifier 100 at relatively high frequencies. In this embodiment, section 202 includes an inductor L2 coupled between node 204 and a capacitor C4, which is in turn serially coupled with a resistor R7, which is in turn coupled with reference node 205. Inductor L2 is also coupled between node 204 and a second capacitor C3, which is in turn coupled with reference node 205.

Artificial transmission line section 201 is preferably configured to equalize operation of amplifier 100 over substantially the entire range of operation frequencies. Section 201 preferably balances the input impedance values of sections 202 and 203. This can facilitate achievement of input broadband matching at the source (i.e., input) end. TWM broadband matching unit 110 and input buffer 111 maintain $S_{11}$ at a relatively constant level even during variation of the DC bias conditions, mainly because sections 201 and 202 are the artificial transmission line sections that most significantly effect $S_{11}$ of amplifier 100 over the range of operable frequencies. In this embodiment, section 201 includes an inductor L1 coupled between node 204 and input node 101. Also coupled with input node 101 is a first capacitor C1, which is coupled between node 204 and reference node 205. A second capacitor C2 is coupled between node 204 and reference node 205.

Input buffer unit 111 is preferably configured as a common collector amplifier. As mentioned above, input buffer unit 111 can include transistor T1, the base of which is coupled to artificial transmission line section 203. The collector of transistor T1 is coupled with power supply node 206 and the emitter of transistor T1 is coupled with reference node 205 by way of a resistor R1.

Gain stage 103 preferably includes amplifier unit 112 and gain peaking unit 114. Amplifier unit 112 can be configured as any amplifier in accordance with the need of the application. In this exemplary embodiment, amplifier unit 112 is a cascode amplifier. Here, cascode amplifier 112 includes two BJT's, transistors T2 and T3. The base of transistor T2 is coupled with the emitter of transistor T1 and is configured to receive an output signal from input stage 102. The emitter of transistor T2 is coupled with reference node 205 and the collector of transistor T2 is coupled with the emitter of transistor T3.

The collector and base of transistor T3 are coupled with gain peaking unit 114. The collector of transistor T3 is coupled with power supply node 206 by way of a resistor R8. The base of transistor T3 is labeled node 207 and is coupled with gain peaking unit 114. In this embodiment, gain peaking unit 114 includes a resistor R3 coupled between node 207 and a power supply node 210 connected to a second power supply, preferably set for biasing. A series connection of an inductor L4, a capacitor C7 and a resistor R2 is coupled between node 207 and reference node 205.

The transistors within gain stage 103 are configured to operate at a typical current density, not a relatively high current density like the transistors in conventional broadband amplifier implementations. Gain stage 103 is preferably configured to operate with the desired bandwidth and a high gain-bandwidth product without the increased reliability concerns that come with operation at high current densities. Gain stage 103 is also preferably configured to operate with reduced dc power consumption.

In this embodiment, the negative resistance of gain peaking unit 114 can be controlled and used to lower the base resistance of transistor T3, which in turn allows the generation of the gain peaking preferably around the amplifier 3-db bandwidth. Preferably, inductor L4 and capacitor C7 are used to control the center frequency of the gain peaking, while resistor R2 is used to suppress the amount of peaking in order to improve the stability of broadband amplifier 100. The optimized values of inductor L4, capacitor C7 and resistor R2 depend on the parameters of transistors T2 and T3 and the desired bandwidth of amplifier 100.

In one exemplary embodiment, the following equations (1)-(4) can be used to determine values for inductor L4, capacitor C7 and resistor R2.

$$f_o = \frac{1}{2\pi\sqrt{L_4 C_u}} \quad (1)$$

$$L_4 = \frac{1}{4} \cdot \frac{1}{C_u f_o 2\pi^2} \quad (2)$$

$$C_7 = C_\pi \quad (3)$$

$$\frac{\sqrt{\frac{L_4}{C_u}}}{R_2 + r_i + R_L} = 3 - 5 \quad (4)$$

In equations (1)-(4), $L_4$ is the inductance of inductor L4, $C_7$ is the capacitance of the capacitor C7, $C_\pi$ is the value of the base-emitter capacitance of transistor T3, $C_u$ is the base-collector capacitance of the transistor T3, $R_2$ is the resistance of resistor R2, $R_L$ is the resistance of resistor R8, and $r_i$ is the input or base resistance of transistor T3.

Figure 3A:
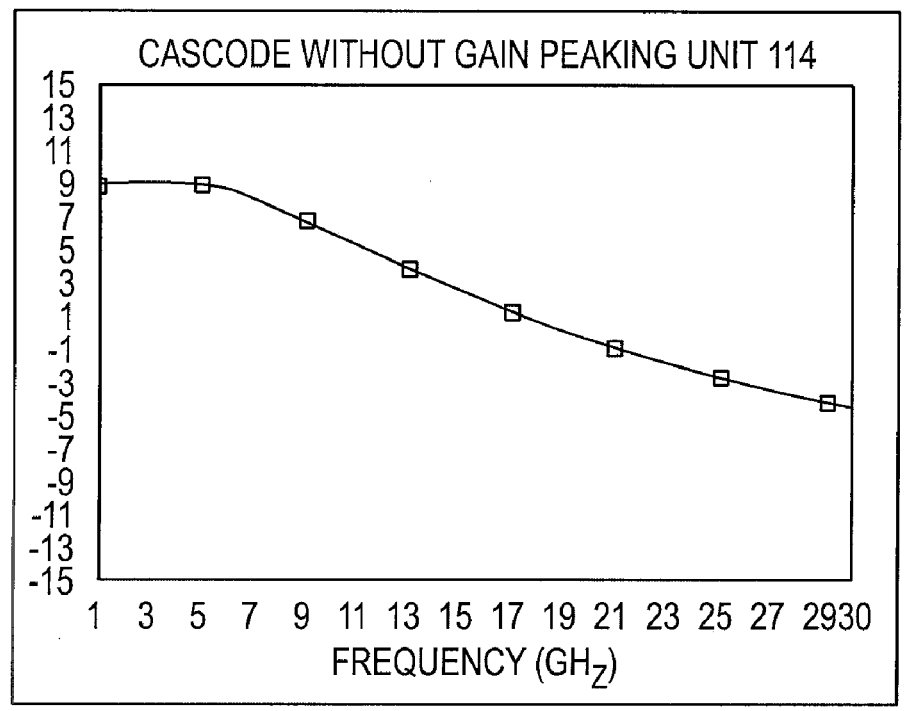
FIGS. 3A-B are graphs depicting simulated gain (S21) versus frequency for an exemplary embodiment of a cascode amplifier without an exemplary embodiment of an RLC network and with an exemplary embodiment of an RLC network, respectively.
Figure 3B:
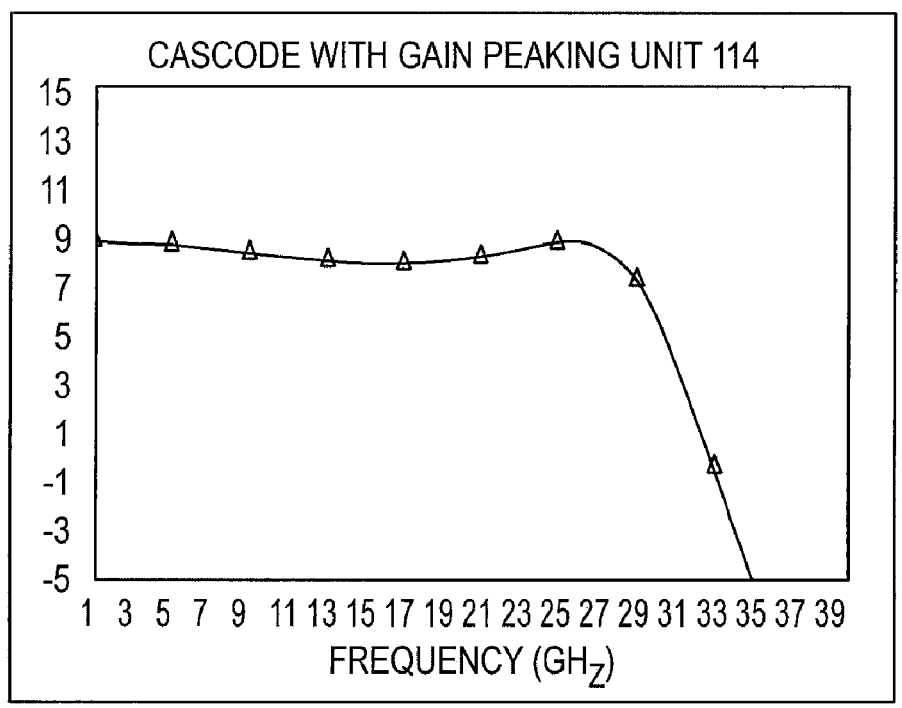

FIGS. 3A-B are graphs of simulated gain ($S_{21}$) versus frequency for cascode amplifier 112 without gain peaking unit 114 and with gain peaking unit 114, respectively, under the same dc biasing conditions. These results show that the bandwidth of cascode amplifier 112 can be increased by approximately 200% with gain peaking unit 114.

Referring back to FIG. 2, output stage 104 is configured to enable broadband amplifier 100 to achieve a low $S_{22}$ over the operation bandwidth and the enable the output signal driving capability. In this embodiment, common collector amplifier 115 includes transistors T4 and T5. The emitter of transistor T4 is coupled to reference node 205 while the base and collector of transistor T4 are coupled together. The collector of transistor T5 is coupled with power supply node 206 and the base of transistor T5 is coupled with the collector of transistor T3 in gain stage 103. The collector-base connection of transistor T4 and the collector of transistor T5 are both coupled with RC (resistance-capacitance) compensation unit 116.

Common collector amplifier 115 can be used to obtain an high input impedance in order to lower loss when the input impedance is absorbed into artificial transmission line sections 201-203 of input stage 102. Common collector amplifier 115 preferably has a negative resistance at it's input node (the base of transistor T5 in this embodiment) in order to reduce the base resistance of transistor T3. Common collector amplifier 115 also preferably lowers the input equivalent capacitance to allow higher bandwidths to be achieved.

RC compensation unit 116 is configured to provide output matching for the next stage coupled to the output of amplifier 100 and also to extend the operational frequency of amplifier 100. In this embodiment, RC compensation unit 116 includes resistors R4 and R5 connected in series between the collector-base connection of transistor T4 and the collector of transistor T5. RC compensation unit 116 also includes a capacitor C8 coupled between resistors R4 and R5 and reference node 205 and a capacitor C9 coupled between the base of transistor T5 and reference node 205. Output node 105 is also coupled with the base of transistor T5. The use of RC compensation unit 116 alleviates the need to use an additional 50Ω termination for matching an output node 105.

Additional exemplary embodiments of broadband amplifier are discussed in Huai Gao et al., "*A New Traveling Wave Matching Structure for Enhancing the Bandwidth of MMIC Broadband Amplifiers*," IEEE Microwave and Wireless Components Letter, Vol. 15 No. 8, August 2005, and Huai Gao et al., "*A Novel Design Technique for Bandwidth Enhancement in InGaP HBT Broadband Amplifiers*," TENCOM 2004, 2004 IEEE Region 10 Converence, Nov. 21-21, 2004, pages 632-634, both of which are fully incorporated by reference herein.

Figure 4:
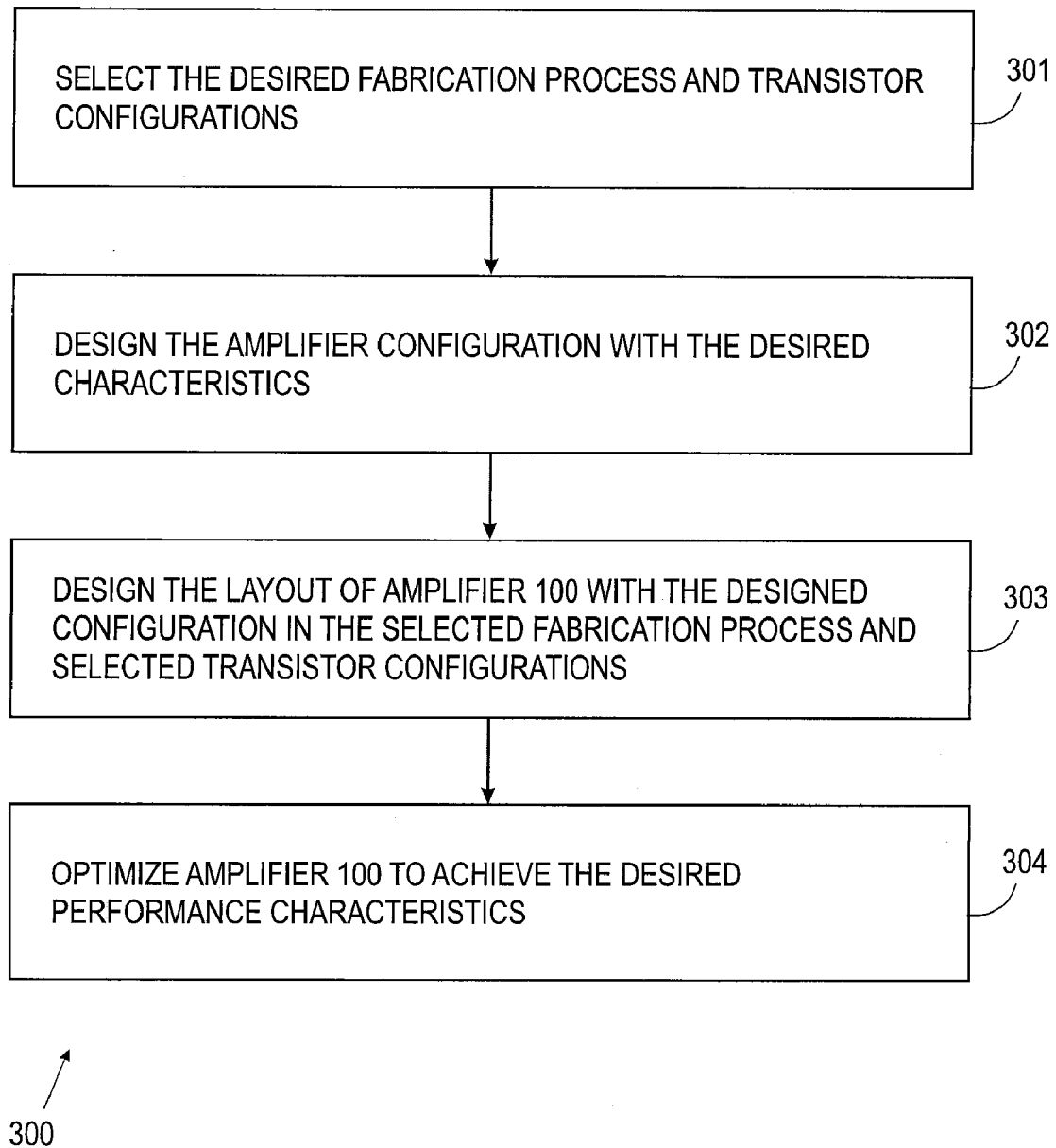
FIG. 4 is a block diagram depicting an exemplary embodiment of a method of designing the broadband amplifier.

FIG. 4 is a flow chart depicting an exemplary method 300 of designing broadband amplifier 100. At 301, the fabrication process and transistor configurations are selected from a list including, but not limited to, GaAs HBTs, SiGe HBTs, InP HBTs, InGaP HBTs, GaAs FETs, InP FETs, Si FETs, Si BJTs and the like. At 302, the amplifier is designed with the desired performance characteristics. For instance, to design a configuration similar to the embodiment described with respect to FIG. 2, input stage 102 is designed with a common-collector amplifier, gain stage 103 is designed with cascode amplifier 112 and output stage 104 is designed with common-collector amplifier 115. Next, TWM broadband matching unit 110 in input stage 102 is designed. Then, the series of resistor(s), inductor(s) and/or capacitor(s) is designed for the gain peaking unit 114. Output stage 104 is then designed with RC compensation unit 116 and any preliminary optimization can be performed for amplifier 100. At 303, the layout of amplifier 100 in the selected fabrication process with the selected transistor configurations is designed. Finally, at 304, broadband amplifier 100 is optimized to achieve the desired performance characteristics. It should be noted that each of these steps are not required to be performed in the order they have been described.

It should be noted that the embodiments described herein are merely illustrative of select configurations of broadband amplifier 100 and methods of designing amplifier 100 and are not intended to limit broadband amplifier 100 in any way. For instance, other types of transistors can be used in place of HBTs. The placement and connection of each resistor, inductor and capacitor is designed to achieve a certain effect, such as the provision of a certain load or impedance, the provision of a certain bias and the like, and one of ordinary skill in the art will readily recognize that other combinations of one or more resistors, inductors and/or capacitors can be used to achieve the same effect. Furthermore, one of skill in the art will readily recognize the multiple ways in which inductors, capacitors and resistors can be implemented in a semiconductor device and, accordingly, the broadband amplifier is not limited to the use any one type of inductor, capacitor and resistor. Also, although broadband amplifier 100 is preferably implemented in a non-distributed architecture, it may also be implemented in a distributed architecture if desired. Furthermore, broadband amplifier can be implemented with numerous power supplies and reference supplies as desired.

In the foregoing specification, the invention has been described with reference to specific embodiments thereof. It will, however, be evident that various modifications and changes may be made thereto without departing from the broader spirit and scope of the invention. For example, each feature of one embodiment can be mixed and matched with other features shown in other embodiments. Features and processes known to those of ordinary skill may similarly be incorporated as desired. Additionally and obviously, features may be added or subtracted as desired. Accordingly, the invention is not to be restricted except in light of the attached claims and their equivalents.

What is claimed is:

1. A broadband amplifier having a non-distributed configuration, comprising:
    an input stage comprising a broadband matching unit coupled with an input buffer unit, the input stage configured to receive an input signal, wherein the broadband matching unit comprises an artificial transmission line;
    a gain stage coupled with the input stage, the gain stage comprising an amplifier unit coupled with an RLC network; and
    an output stage coupled with the gain stage, the output stage comprising a common collector amplifier, the output stage configured to output an output signal representative of an amplified input signal.

2. The broadband amplifier of claim 1, wherein the broadband matching unit comprises:
    an input node configured to receive the input signal;
    a first LC section coupled with the input node, the first LC section having a first characteristic impedance and a first cutoff frequency;
    a second LC section coupled with the first LC section, the second LC section having a second characteristic impedance and a second cutoff frequency; and
    a third LC section coupled with the first and second LC sections and the input buffer unit, the third LC section having a third characteristic impedance and a third cutoff frequency, wherein each LC section is coupled together at the same node.

3. The broadband amplifier of claim 2, wherein the first LC section is configured to balance an input impedance of the second and third LC sections.

4. The broadband amplifier of claim 2, wherein the amplifier unit in the gain stage comprises a cascode amplifier comprising a first transistor having a first base, a first emitter and a first collector, wherein the first base is coupled with the input buffer unit and the first emitter is coupled with a reference node and a second transistor having a second base, a second emitter and a second collector, wherein the second base is coupled with the RLC network, the second emitter is coupled with the first collector of the first transistor and the second collector is resistively coupled with a power supply node.

5. The broadband amplifier of claim 1, wherein the amplifier unit comprises a cascode amplifier.

6. The broadband amplifier of claim 5, wherein the cascode amplifier comprises:
    a first transistor having a first base, a first emitter and a first collector, wherein the first base is coupled with the input buffer unit and the first emitter is coupled with a reference node; and
    a second transistor having a second base, a second emitter and a second collector, wherein the second base is coupled with the RLC network, the second emitter is coupled with the first collector of the first transistor and the second collector is resistively coupled with a first power supply node.

7. The broadband amplifier of claim 6, wherein the RLC network comprises an inductor, a capacitor and a first resistor serially coupled between the second base of the second transistor and the reference node.

8. The broadband amplifier of claim 7, where the RLC network further comprises a second resistor coupled between the second base of the second transistor and a second power supply node.

9. The broadband amplifier of claim 8, wherein the gain stage has a gain peaking center frequency and the inductor and capacitor are configured to control the gain peaking center frequency.

10. The broadband amplifier of claim 5, wherein the broadband matching unit comprises an input node configured to receive the input signal, a first LC section coupled with the input node, the first LC section having a first characteristic impedance and a first cutoff frequency, a second LC section coupled with the first LC section, the second LC section having a second characteristic impedance and a second cutoff frequency and a third LC section coupled with the first and second LC sections and the input buffer unit, the third LC section having a third characteristic impedance and a third cutoff frequency, wherein each LC section is coupled together at the same node.

11. The broadband amplifier of claim 1, wherein the RLC network is configured to generate gain peaking around a 3-db (decibel) bandwidth of the amplifier.

* * * * *

UNITED STATES PATENT AND TRADEMARK OFFICE
CERTIFICATE OF CORRECTION

PATENT NO. : 7,652,539 B2  Page 1 of 1
APPLICATION NO. : 11/264291
DATED : January 26, 2010
INVENTOR(S) : Gao et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 119 days.

Signed and Sealed this

Twenty-third Day of November, 2010

David J. Kappos
*Director of the United States Patent and Trademark Office*